US005528694A

United States Patent [19]

Van De Kerkhof et al.

[11] Patent Number: 5,528,694

[45] Date of Patent: Jun. 18, 1996

[54] AUDIO SIGNAL PROCESSING ARRANGEMENT FOR DERIVING A CENTRE CHANNEL SIGNAL AND ALSO AN AUDIO VISUAL REPRODUCTION SYSTEM COMPRISING SUCH A PROCESSING ARRANGEMENT

[75] Inventors: Leon M. Van De Kerkhof; Paulus M. Boers, both of Eindhoven; Hendrikus De Kluijver, Utrecht, all of Netherlands

[73] Assignee: U.S. Philips Corporation, New York, N.Y.

[21] Appl. No.: 186,396

[22] Filed: Jan. 25, 1994

[30] Foreign Application Priority Data

Jan. 27, 1993 [EP] European Pat. Off. .............. 93200208

[51] Int. Cl.[6] .................................................... H03G 3/00

[52] U.S. Cl. ................................................ 381/27; 381/22

[58] Field of Search ................................ 381/18, 22, 27, 381/1, 57, 108

[56] References Cited

U.S. PATENT DOCUMENTS 4,024,344 5/1977 Dolby et al. ................................ 179/1

4,685,136 8/1987 Latshaw .................................... 381/27

4,747,142 5/1988 Tofte ........................................ 381/27

*Primary Examiner*—Stephen Brinich

*Attorney, Agent, or Firm*—Edward W. Goodman

[57] ABSTRACT

An audio signal processing arrangement includes a first filter (20) for splitting off signal components from the left channel signal (L) at least within one frequency band. Signal components are split off from the right channel signal (R) by a second filter (23). The output signals of the filters (20 and 23) are compared with the right channel signal (R) and the left channel signal (L), respectively. The filter parameters of the filters (20 and 23) are adjusted to values at which there is maximum correlation between the compared signals according to a given criterion. The center channel signal is derived in dependence on the filter adjustment. This can be effected by combining the output signals of the filters (20 and 23). In this manner, a center channel signal is obtained formed by the correlating left and right channel signal components, so that the stereo image is hardly disturbed by the addition of the center channel signal, whereas the perceived position of the virtual sources in the stereo image becomes less dependent on the listener's position with respect to the left and right loudspeakers.

9 Claims, 3 Drawing Sheets

AUDIO SIGNAL PROCESSING ARRANGEMENT FOR DERIVING A CENTRE CHANNEL SIGNAL AND ALSO AN AUDIO VISUAL REPRODUCTION SYSTEM COMPRISING SUCH A PROCESSING ARRANGEMENT

BACKGROUND OF THE INVENTION

1. Field of the Invention

The invention relates to an audio signal processing arrangement for deriving a center channel signal from a stereophonic signal that includes a left and a right channel signal.

The invention further relates to an audio visual reproduction system comprising a picture display device, a first loudspeaker for reproducing a left channel signal, a second loudspeaker for reproducing a right channel signal and a third loudspeaker for reproducing a center channel signal, the audio visual reproduction system comprising an audio signal processing arrangement of the type defined above.

2. Description of the Related Art

The use of a center channel signal in a stereophonic reproduction system has the effect that the position of the perceived virtual sound sources depends less on the position taken up by the listener with respect to the left and right loudspeakers. This is especially important in the case where the reproduction of stereophonic information is combined with a picture display device such as, for example, television with a stereophonic reproduction system. For, when a displayed audio visual program is followed, it is important that the position of the virtual sound sources be not perceived far from the position of the picture screen.

A circuit for deriving a center channel signal is known from U.S. Pat. No. 4,034,344.

In the circuit described in above Patent, there is determined by comparison whether the low-frequency region of the audio signal spectrum comprises correlating components. For this comparison, the low-frequency signal components in the left channel signal are multiplied by the low-frequency components in the right channel signal. The DC component of the result of the multiplication is compared with the sum of the DC components of the rectified channel signals. Depending on the result of the comparison, a larger or smaller part of the sum of low-frequency components of the left and right channel signals is used as a center channel signal. A drawback of prior-art circuit is the relatively small degree of accuracy with which the correlation is determined.

SUMMARY OF THE INVENTION

It is an object of the invention to provide an arrangement by which the correlation is determined more accurately.

According to the invention, this object is achieved by an arrangement as defined in the opening paragraph, characterized in that the arrangement comprises first filter means for splitting off signal components from the left channel signal at least within one frequency band, this filter means having at least one adjustable filter parameter, first comparator means for comparing with the right channel signal the signal split off from the left channel signal by the adjustable filter, and adjusting means for adjusting, in response to the result of the comparison, the adjustable filter parameter(s) to a value at which the signal power of the difference between the compared signals is, in essence, minimal according to a given criterion, second filter means for splitting off signal components from the right channel signal at least within said frequency band, the second filter means having at least one adjustable filter parameter, second comparator means for comparing with the left channel signal the signal split off from the right channel signal by the adjustable filter, and adjusting means for adjusting, in response to the result of the comparison, the adjustable filter parameter(s) to a value at which the signal power of the difference between the compared signals is, in essence, minimal according to a given criterion, and signal processing means for deriving the center channel signal in dependence on the adjustment of the first and second filter means.

An embodiment for the arrangement according to the invention is characterized, in that the signal deriving means comprise signal combining means for combining the output signals of the first and second filter means to become the center channel signal.

In this embodiment, the center channel signal comprises the output signals of the filters. Since the filter parameters are set to values at which there is a minimum signal power of the difference between the compared signals, these output signals form the correlated components in the left and right channel signals. This means that only correlated components from the left and right channel signals are used for the center channel signal, whereas the uncorrelated components, which largely contribute to the stereo image, are not used. The contribution made to the stereo image by the uncorrelated components is therefore not disturbed in the arrangement according to the invention. This is in contrast with the arrangement described in U.S. Pat. No. 4,024,344, in which the left and right channel signals are represented equally strongly in the center channel signal and thus result in a disturbance which is noticeable in the stereo image.

The virtual sound sources in the stereo image generally differ both in place and frequency. Therefore, it is advantageous to split off the correlated signal components for different frequency bands. In this manner there is then achieved that the correlated components for different sound sources are split off independently.

An embodiment of the invention in which this is realized is characterized, in that the arrangement comprises a first filter bank for splitting up the left channel signal into a plurality of left sub-signals whose frequency spectra are situated in different frequency bands, a second filter bank for splitting up the right channel signal into a plurality of right sub-signals whose frequency spectra correspond to the frequency bands the left channel signal is split up into, the splitter means being arranged for splitting up correlated signal portions into a plurality of different frequency bands on the basis of the left and right sub-signals.

It is to be preferred to select the frequency bands in such a way that the ratio between the lowest and highest frequency within a band is the same for all the frequency bands. This is advantageous in that the low-frequency bands have a larger frequency resolution. Since the sound sources at low frequencies have most energy, these sources had rather be separated. This splitting up is in keeping with the analysis of sources by the human auditory system.

A further embodiment for the arrangement is characterized, in that the arrangement comprises signal removing means for removing from the left and right channel signals the components split off for the benefit of the center channel signal. This achieves that the total signal power is unaffected by the splitting off for the benefit of the center channel signal.

BRIEF DESCRIPTION OF THE DRAWINGS

The invention will be further explained hereinbelow with reference to the drawing FIGS. 1 to 6, in which.

DESCRIPTION OF THE PREFERRED EMBODIMENTS

Figure 1:
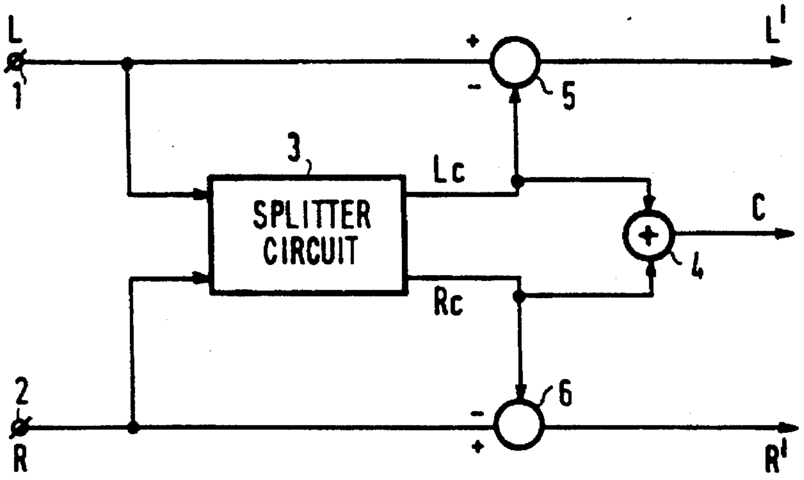
FIGS. 1, 2, 3 and 5 show embodiments for the audio signal processing arrangements according to the invention.

FIG. 1 shows in a diagram an audio signal processing arrangement for deriving a center channel signal from a left and a right channel signal of a stereophonic signal. The arrangement has an input 1 and an input 2 for receiving a left channel signal L and a right channel signal R, respectively. The channel signals L and R are fed to a splitter circuit 3 for splitting off from at least one of the signals L and R, signal components that are identical to the signal components in the other channel signal. The component split off from the left channel signal L is referenced Lc and the signal split off from the right channel signal R is referenced Rc. The signals Lc and Rc that have been split off are combined by a customary signal combining circuit, for example, an adder 4 to become the center channel signal C. To keep the total signal contents of the reproduced information equal to the total signal contents of the original channel signals L and R, preferably the identical components Lc and Rc that have been split off are subtracted from the original channel signals L and C by customary subtracter circuits 5 and 6. The left and right channel signals obtained after subtraction are referenced L' and R'.

Figure 2:
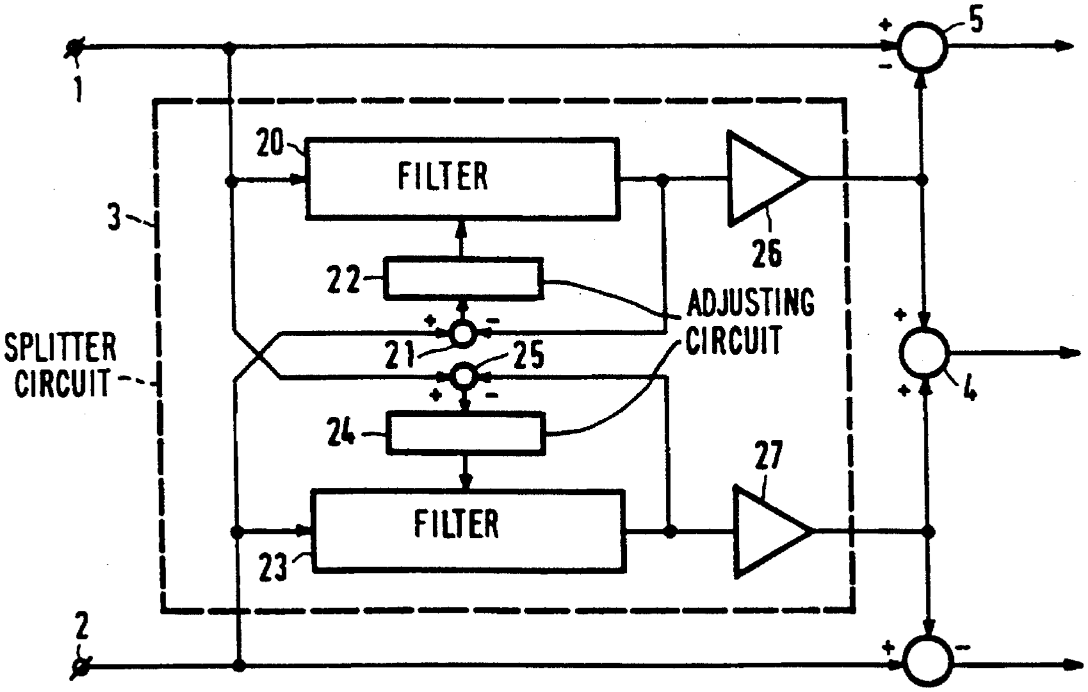

FIG. 2 shows an embodiment for the splitter circuit in greater detail. The splitter circuit comprises a filter 20 having at least an adjustable filter parameter. An input of the filter 20 is coupled to the input 1 for receiving the left channel signal L. The output of the filter is coupled to a first input of a comparator circuit 21. A second input of the comparator circuit 21 is supplied with the right channel signal. The comparator circuit 21 is of a customary type that detects the difference between the signal supplied to the two inputs. A signal representing the detected difference is applied to an adjusting circuit 22 for adjusting the filter parameters of filter 20. The adjusting circuit 22 is of a type that adjusts, in response to the detected difference, the filter parameters to a value at which the signal power of the difference between the two compared signals is, in essence, minimal according to a given criterion. A suitable criterion is the what is commonly referred to as Least Mean Square criterion, for which the mean square of the difference signal is minimal. If the filter 20 is a digital filter having a transfer function $$H(z) = \sum_{n=0}^{N} C_n \cdot z^{-n}$$

the filter parameters may then be obtained from the relations below when the Least Mean Square criterion is implemented.

$$C_n(k+1)=C_n(k)+\mu.e(k).x(k-n)$$

where

μ is a convergence parameter determining the rate of adaptation, e(k) is the error signal during sample k, x(k–n) is a sample that is shifted by n positions relative to x(k).

It will be evident to the expert that also different criteria from said Least Mean Square criterion can be used for adjusting the filter parameters. It is always essential that a criterion be selected according to which filter parameters are obtained that provide essentially maximum correlation between the compared signals.

Since the filter values are adjusted to a value at which the signal power of the difference between the compared signals is minimal, the output signal of the filter forms a signal component of the left channel signal that shows much correlation with the right channel signal. This signal component may then also be used for the center channel signal. Similarly, by means of a filter 23, an adjusting circuit 24 and a comparator circuit 25, a signal component that has maximum correlation with the left channel signal is split off from the right channel signal. The signal components at the outputs of the filters 20 and 32 are added together by the adder circuit 4. The output signal of the adder circuit 4 forms the center channel signal. An attenuator 26 can be inserted between the filter 20 and the adder circuit and it attenuates the output signal of the filter 20 by a specific factor before applying this signal to the adder circuit 4 and the subtracter circuit 5. In that case there is inserted, preferably between filter 23, adder circuit 4 and subtracter circuit 6, an attenuator 27 that has the same attenuation factor. By utilizing the attenuators 26 and 27, the extent to which the center channel signal is generated can be controlled. As a result, there may be avoided that too large or too small a portion of both stereophonic signals is used for the center signal.

Figure 3:
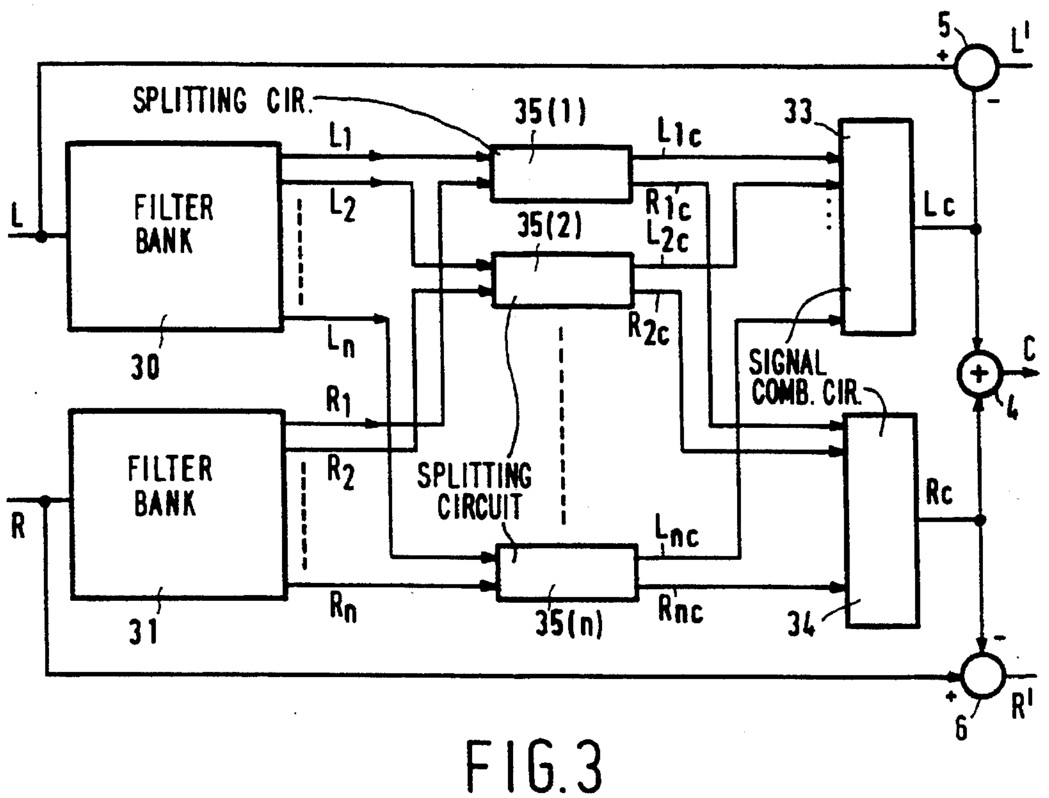

Furthermore, there should be observed that in lieu of subtracting the output signal of filter 20 from the left channel signal, it is alternatively possible to subtract this output signal from the right channel signal, while in that case the output signal of the filter 23 is subtracted from the left channel signal as is shown diagrammatically in FIG. 3. However, this may have the drawback of opposite phase crosstalk between the adapted left channel signal and the adapted right channel signal.

Filters having a plurality of adjustable filter parameters have been described hereinbefore. The use of filters having only a single filter parameter is also alternatively possible. In that case, what is commonly referred to as Newton method is pre-eminently suitable for deriving the filter parameter, as will be explained hereinafter.

If the transfer function of filter 20 is equal to c', and the transfer function of filter 23 is equal to c", the output signal of comparator circuit 21 will be $$e1=(L(n)-c'.R(n))$$

and the output signal of the comparator circuit 25 will be $$e2=(R(n)-c''L(n))$$

with L(n) and R(n) being the successive sample values of the left and right channel signals.

According to the Newton method, the filter values c' and c" can be determined according to the following relations:

$$c'(n+1)=c'(n)+\frac{L(n)-c'(n)\cdot R(n)}{R(n)}$$

and $$c''(n+1)=c''(n)+\frac{R(n)-c''(n)\cdot L(n)}{L(n)}$$

Since the stereo image does not change rapidly, it is advantageous to slightly attenuate the adaptation of the filter parameters c' and c", for example, by means of a low-pass filtering operation.

The center channel signal may be derived from the output signals of the filters having the transfer functions c' and c". Alternatively, however, it is possible to derive the center channel signal indirectly from the filter adjustment. A suitable method is the method for which first the smaller value is selected from c' and c", and the center channel signal as well as the left channel signal are derived as a function of this smaller value according to the following relations:

$$L'=(1-a^2)\ L$$

$$R'=(1-a^2)\ R$$

$$C=a^2.L+a^2.R$$

where a is the smaller value of c' and c", C is the center channel signal, L and R are the incoming left and right channel signals and L' and R' are the outgoing left and right channel signals.

Figure 5:
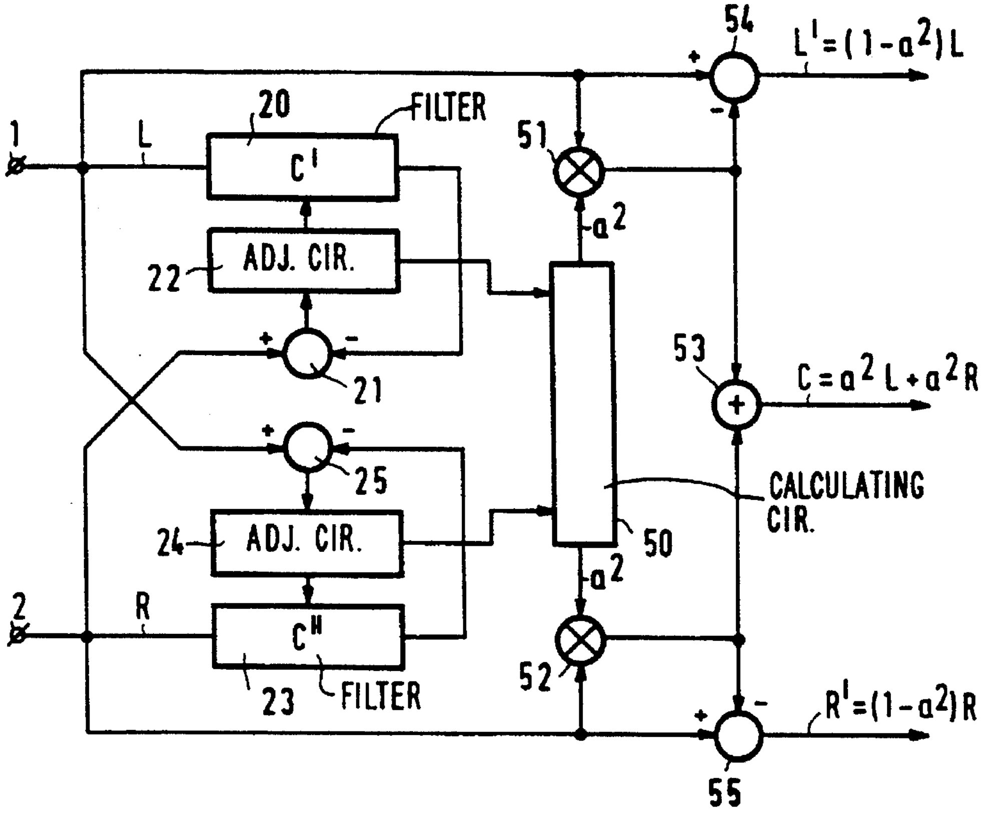

FIG. 5 shows an embodiment for the arrangement according to the invention, in which the center channel signal is indirectly derived from the filter adjustments.

In this Figure the components corresponding to those in previously described Figures are denoted by like reference characters. The adjusting circuits 22 and 24 are of a type determining the value of c' and c" according to the previously discussed Newton method.

The filters 20 and 23 are adjusted according to the determined values of c' and c". Since the filters have only a single adjustable filter parameter, for the filters it may be sufficient to have an amplifier with an adjustable gain factor. The adjusting circuits 22 and 24 are coupled to a circuit 50 to supply the values c' and c" to the circuit 50. The circuit 50 is of a type selecting the smaller value from the two received values c' and c". Furthermore, the circuit 50 determines a value $a^2$ that is equal to the squared selected smaller value. The value $a^2$ is applied to a first input of a multiplier 51. A second input of the multiplier 51 is supplied with the left channel signal. The output of the multiplier 51 produces a signal equal to $a^2$L. Similarly, a multiplier 52 produces a signal that is equal to $a^2$R. An adder circuit 53 derives the center channel signal C from the signals $a^2$L and $a^2$R.

The signal $a^2$L is subtracted from the left channel signal by a subtracter circuit 54. In this manner the adapted left channel signal L' is obtained. Similarly, the adapted right channel signal R' is derived from the right channel signal R and the signal $a^2$R by subtracter circuit 55.

In the embodiment shown in FIG. 5 no center channel signal is generated in the case where the left and right channel signals are totally uncorrelated. For, in that case the found value of $\alpha$ will be equal to zero. With a fully correlated signal (mono signal) the adapted left channel signal L' and the adapted right channel signal R' will be equal to zero and only a center channel signal will be generated. The value of $\alpha$ will then be equal to 1.

Figure 4:
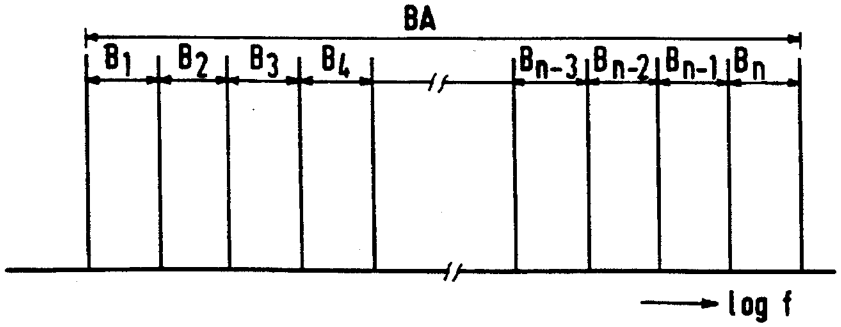
FIG. 4 shows a subdivision of the frequency spectrum of the left or right channel signal into a plurality of frequency bands.

The virtual sound sources generally differ both in place and frequency. Therefore, it is advantageous to split off the correlated signal components for different frequency bands. In this manner the correlated components for different sound sources are split off independently. An embodiment in which this is realized is shown in FIG. 3. This embodiment comprises a filter bank 30 splitting up the left channel signal into a plurality of sub-signals L1, . . . , Ln having different frequency bands B1, . . . , Bn. FIG. 4 shows an attractive subdivision of the channel signal. Herein BA denotes the width of the frequency spectrum of the channel signal L. The subdivision into the frequency bands is preferably such that the ratio between the lowest and highest frequencies in the band is essentially equal for all the bands. This is advantageous in that a better splitting off of the input signal is obtained in sources that can be controlled independently.

Similar to the left channel signal, the right channel signal is split up by a filter bank 31 into sub-signals R1, . . . , Rn whose frequency spectra correspond to those of the sub-signals L1, . . . , Ln. For each frequency band, a center channel signal is derived referenced C1, . . . , Cn by n splitter circuits 35(1), . . . , 35(n) (similar to the splitter circuit shown in FIG. 2). The center channel signal C split off from the left channel signal is then formed from the split-off signals L1c, . . . , Lnc by a signal combining circuit 33, for example, a restoring filter of a customary type. The signal components R1c, . . . , R2c split off from the sub-signals R1, . . . , Rn may similarly be combined by a signal combining circuit 34 to the total signal Rc split off from the right channel signal. The adder circuit 4 is then again instrumental in forming the center channel signal C from this signal Rc. The split-off components Lc and Rc are removed from the left and right channel signals by the subtracter circuits 5 and 6.

Figure 6:
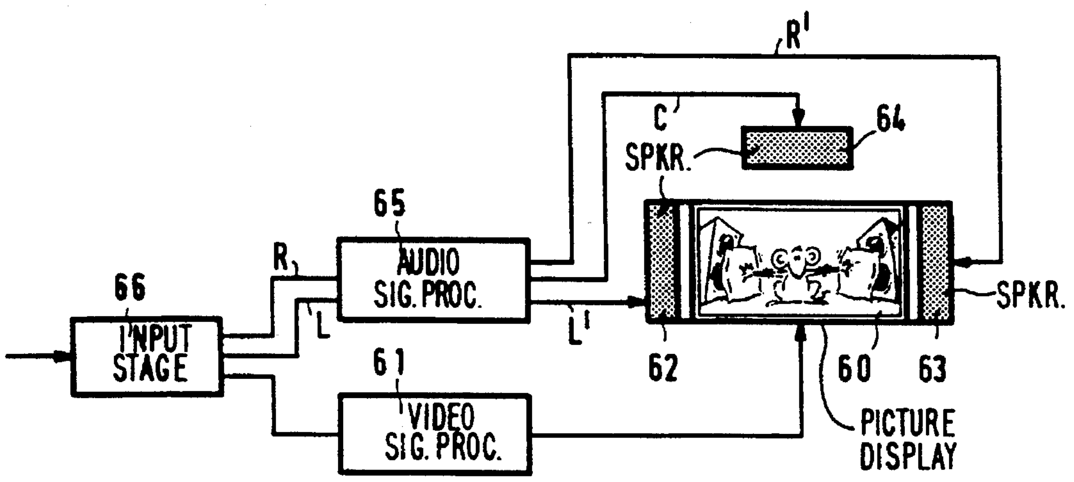
FIG. 6 shows an audio visual reproduction system according to the invention.

FIG. 6 shows an embodiment for an audio visual reproduction system according to the invention. The system comprises a picture display device which includes a picture display element 60, for example, formed by a cathode ray tube, and a picture signal processor 61.

Furthermore, the system includes an input stage 66 for recovering a picture signal and a stereophonic signal from a received input signal, for example, a television signal. The picture signal processor 61 renders the picture signal suitable for the picture display element 60 used.

To the left of the picture display element 60 is installed a loudspeaker 62. To the right of the picture display element is installed a loudspeaker 63. Midway between the loudspeakers 62 and 63 is installed a loudspeaker 64. The audio visual reproduction system further includes an audio signal processor 65 of a type described with reference to the drawing FIGS. 1 to 5. The audio signal processor 65 is coupled to the input stage 62 for receiving the left channel signal (L) and the right channel signal (R). Furthermore, the processor 65 is coupled to the loudspeakers 62, 63, 64 for supplying the adapted left channel signal L', the adapted right channel signal R' and the center channel signal C to these loudspeakers.

We claim:

1. Audio signal processing arrangement for deriving a center channel signal from a stereophonic signal that includes a left and a right channel signal, characterized in that the arrangement comprises first filter means for splitting off signal components from the left channel signal at least within one frequency band, said first filter means having at least one adjustable filter parameter, first comparator means for comparing with the right channel signal the signal split off from the left channel signal by the adjustable filter, and adjusting means for adjusting, in response to the result of the comparison, the adjustable filter parameter(s) to a value at which the signal power of the difference between the compared signals is less than a first predetermined minimum value, second filter means for splitting off signal components from the right channel signal at least within said frequency band, said second filter means having least one adjustable filter parameter, second comparator means for comparing with the left channel signal the signal split off from the right channel signal by the adjustable filter, and adjusting means for adjusting, in response to the result of the comparison, the adjustable filter parameter(s) to a value at which the signal power of the difference between the compared signals is less than a second predetermined minimum value, and signal processing means for deriving the center channel signal in dependence on the adjustment of the first and second filter means.

2. Arrangement as claimed in claim 1, characterized in that the signal deriving means comprise signal combining means for combining the output signals of the first and second filter means to become the center channel signal.

3. Arrangement as claimed in claim 1, characterized in that the signal deriving means comprise combining means for combining the received left channel signal and the received right channel signal to become the center channel signal, the contribution of the left channel signal and the right channel signal being determined by weight factors, and the arrangement comprising deriving means for deriving the weight factors from the filter adjustments.

4. Arrangement as claimed in claim 1, characterized in that the arrangement comprises a first filter bank for splitting up the left channel signal into a plurality of left sub-signals whose frequency spectra are situated in different frequency bands, and a second filter bank for splitting up the right channel signal into a plurality of right sub-signals whose frequency spectra correspond to the frequency bands the left channel signal is split up into, the splitter means being arranged for splitting up correlated signal components into a plurality of different frequency bands on the basis of the left and right sub-signals.

5. Arrangement as claimed in claim 4, characterized in that the ratio between the upper and lower frequency within a frequency band is essentially the same for all the frequency bands in which the spectra of sub-signals are situated that are used for splitting off correlated signal portions.

6. Arrangement as claimed in claim 1, characterized in that the arrangement comprises signal removing means for removing from the left and right channel signals the components split off for the benefit of the center channel signal.

7. Audio visual reproduction system comprising a picture display device, a first loudspeaker for reproducing a left channel signal, a second loudspeaker for reproducing a right channel signal and a third loudspeaker for reproducing a center channel signal, the audio visual reproduction system comprising an audio signal processing arrangement as claimed in claim 1, a first output of the audio signal processing arrangement being coupled to the first loudspeaker for supplying the left channel signal, the second output of the audio signal processing arrangement being coupled to the second loudspeaker for supplying the right channel signal, and a third output of the audio signal processing arrangement being coupled to the third loudspeaker for supplying the center channel signal.

8. Arrangement as claimed in claim 2, characterized in that the arrangement comprises a first filter bank for splitting up the left channel signal into a plurality of left sub-signals whose frequency spectra are situated in different frequency bands, a second filter bank for splitting up the right channel signal into a plurality of right sub-signals whose frequency spectra correspond to the frequency bands the left channel signal is split up into, the splitter means being arranged for splitting up correlated signal components into a plurality of different frequency bands on the basis of the left and right sub-signals.

9. Arrangement as claimed in claim 8, characterized in that the ratio between the upper and lower frequency within a frequency band is essentially the same for all the frequency bands in which the spectra of sub-signals are situated that are used for splitting off correlated signal portions.

* * * * *